(12) United States Patent
Li et al.

(10) Patent No.: US 10,333,105 B2
(45) Date of Patent: Jun. 25, 2019

(54) ORGANIC LIGHT EMITTING DISPLAY PACKAGING STRUCTURE AND MANUFACTURING METHOD THEREOF

(71) Applicant: Shenzhen China Star Optoelectronics Technology Co., Ltd., Shenzhen (CN)

(72) Inventors: Wenjie Li, Shenzhen (CN); Jiajia Qian, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 127 days.

(21) Appl. No.: 15/509,197

(22) PCT Filed: Feb. 16, 2017

(86) PCT No.: PCT/CN2017/073727
§ 371 (c)(1),
(2) Date: Mar. 7, 2017

(87) PCT Pub. No.: WO2018/133146
PCT Pub. Date: Jul. 26, 2018

(65) Prior Publication Data
US 2018/0233701 A1    Aug. 16, 2018

(30) Foreign Application Priority Data
Jan. 18, 2017 (CN) .......................... 2017 1 0035207

(51) Int. Cl.
*H01L 51/56* (2006.01)
*H01L 51/52* (2006.01)

(52) U.S. Cl.
CPC .......... *H01L 51/5256* (2013.01); *H01L 51/56* (2013.01); *H01L 2251/301* (2013.01); *H01L 2251/303* (2013.01); *H01L 2251/558* (2013.01)

(58) Field of Classification Search
CPC . H01L 51/56; H01L 51/5256; H01L 51/5246; H01L 51/5237
See application file for complete search history.

(56) References Cited

U.S. PATENT DOCUMENTS

2012/0146492 A1    6/2012  Ryu
2012/0267646 A1*  10/2012  Kim .................... H01L 51/5253
                                       257/88

(Continued)

FOREIGN PATENT DOCUMENTS

CN        2012-109030 A      6/2012

*Primary Examiner* — Thomas L Dickey
(74) *Attorney, Agent, or Firm* — Leong C. Lei

(57) ABSTRACT

An OLED packaging method and an OLED package structure are disclosed. The OLED packaging method combines a dam packaging technology and a thin film encapsulation technology. A dam is used to coffer an organic layer and limit a size thereof to ensure that each organic layer is completely covered an inorganic layer disposed thereon to improve a packaging effect. One mask can be used to produce multiple inorganic layers so an amount of masks is decreased to save costs. The OLED packaging structure combines a dam packaging structure and a thin film encapsulation structure. A dam is used to coffer an organic layer and limit a size thereof to ensure that each organic layer is completely covered an inorganic layer disposed thereon to improve a packaging effect. One mask can be used to produce multiple inorganic layers so an amount of masks is decreased to save costs.

13 Claims, 5 Drawing Sheets

(56) References Cited

U.S. PATENT DOCUMENTS

| | | | |
|---|---|---|---|
| 2015/0228928 A1* | 8/2015 | Kim | H01L 51/5256 |
| | | | 257/40 |
| 2015/0236293 A1* | 8/2015 | Lee | H01L 51/524 |
| | | | 257/40 |
| 2016/0260928 A1* | 9/2016 | Choi | H01L 51/5253 |
| 2016/0268547 A1* | 9/2016 | Kim | H01L 51/5256 |
| 2018/0166525 A1* | 6/2018 | Kim | H01L 27/3276 |
| 2018/0212192 A1* | 7/2018 | Jin | H01L 51/5246 |

* cited by examiner

ORGANIC LIGHT EMITTING DISPLAY PACKAGING STRUCTURE AND MANUFACTURING METHOD THEREOF

FIELD OF THE INVENTION

The present invention relates to a display technique filed, and more particularly to an OLED packaging method and an OLED packaging structure.

BACKGROUND OF THE INVENTION

Organic light Emitting Display (OLED) has a self-luminous, low driving voltage, high luminous efficiency, short response time, high definition and contrast, nearly 180° angle of view, wide operating temperature range, flexible display and large area full color display etc. advantages. The industry recognizes that the OLED as a display device with a most development potential.

OLEDs can be classified into two categories: a passive matrix OLED (PMOLED) and an active matrix OLED (AMOLED), or another two categories: a direct addressing and a thin film transistor array addressing. The AMOLED having multiple pixels arranged in a matrix is deemed as an active display type and is usually used as a high-definition large-size display device.

The OLED device generally includes: a substrate, an anode disposed on the substrate, a hole injection layer disposed on the anode, a hole transport layer disposed on the hole injection layer, a light emitting layer disposed on the hole transport layer, an electron transport layer disposed on the light emitting layer, an electron injection layer disposed on the electron transport layer, and a cathode disposed on the electron injection layer. The OLED device light-emitting principle is that the semiconductor materials and organic light-emitting materials are driven in the electric field by the carrier injection to recombine to light. In particular, the OLED device is usually used indium tin oxide (ITO) electrodes and metal electrodes, respectively, as an anode and cathode thereof. When the Anode and cathode are driven by a certain voltage, electrons and holes from the cathode and anode were injected into the electron transport layer and hole transport layer. The electrons and holes migrate through the electron transport layer and the hole transport layer to the light emitting layer, respectively, and meet in the light emitting layer to form excitons to excite light emitting molecules to emit a visible light by radiation relaxation.

Flexible OLED is an important research aspect of the OLED device. The OLED device in the light-emitting materials are usually polymer or organic small molecules, a material of the cathode is usually a low work function of active metals such as magnesium, aluminum etc. These luminescent materials and the material of the cathode are very sensitive to water vapor and oxygen, so a usage life of the OLED device is greatly reduced if the water and/or oxygen penetrate the OLED device. In order to achieve commercial requirements of the usage life and stability of the OLED device, packaging requirements of the OLED device are very strict. The usage life of the OLED device is usually at least 104 hours, the water vapor transmission rate is less than 10-6 g/m2/day, and the oxygen permeability is less than 10-6 cc/m2/day (1 atm), so the packaging is very important in the production of the OLED device and is also one of key factors affecting a product yield.

The conventional packaging technology includes: (1) a cover packaging technology: a UV curing dam or a dam and filling desiccant (Dam & Fill) coated on a packaging glass/metal is cured to provide a luminous device a relatively confined environment to block an entrance to which the water and oxygen permeate; and (2) a laser packaging technology: a glass glue coated on a packaging glass becomes glass powders after a solvent in the glass glue is evaporated, and after a vapor deposition substrate and the packaging cover are assembled, they are further bonded together by laser-melting the glass powders. The above conventional packaging technology can achieve a blocking effect of water/oxygen, but increases a thickness and weight of the device. It is not conducive for a production of the flexible OLED.

In recent years, the thin film encapsulation (TFE) technology is developed to overcome the drawbacks of conventional packaging technology, does not use the packaging cover and the dam to package the OLED device, and uses the thin film package to replace the conventional glass package. A large-size device package can be achieved and the device is light and thin. The so-called thin film package, that is, inorganic-organic alternating layers are formed on a surface of an OLED region of the substrate to block the water and oxygen by a thin film deposition. In the film packaging structure, the inorganic layer (the main component of silicon nitride, silicon oxide or aluminum oxide) is an effective barrier to water/oxygen, but some pinholes or particles defects are occurred in the production of the inorganic layer process; and the organic layer (including some polymer, silicon-containing organic matter, resin, etc.) is the role of covering the inorganic layer defects, and can release the stress between the inorganic layer to be flat.

As shown in FIG. 1, the conventional thin film package structure includes multiple inorganic layers 200 and multiple organic layers 300 alternately disposed on the OLED device 100. An area of the inorganic layer 200 is equal to that of the organic layer 300. The thin film packaging structure has an advantage of a simple according to claim process, so the deposition of the inorganic layer 200 can be completed by a single mask. However, the deposited inorganic layer 200 does not completely cover the organic layer 300 and the ends of the organic layer 300 are exposed in the air to form an entrance for water vapor. A packaging effect is damaged accordingly. Thus, another film packaging structure (shown in FIG. 2) is appeared and includes multiple inorganic layers 200' and multiple organic layers 300"alternately arranged on the OLED device 100'. The area of the inorganic layer 200' above the organic layer 300' is larger than the area of the organic layer 300' so that each of the organic layers 300' can be completely covered with the inorganic layer 200' thereon and the water vapor is not permeated inside the device through the organic layer 300'. However, since the areas of the inorganic layers 200' are gradually increased from bottom to top of the OLED device 100', so different masks are required to complete the deposition of the inorganic layers 200'. In the process, it needs to swap the mask for several times, so the process is complex and also easily introduces uncontrollable factors.

SUMMARY OF THE INVENTION

A subject of the present invention provides an OLED packaging method to increase a packaging effect and save production costs.

The subject of the present invention further provides an OLED packaging structure with a good packaging effect and low production costs.

To achieve the foregoing subject, the present invention firstly provides the OLED packaging method having following steps of:

step one, providing a substrate on which an OLED device is formed;

step two, forming a first inorganic layer on the OLED device and the substrate, wherein the first inorganic layer covers the OLED device and an area of the first inorganic layer is greater than that of the OLED device;

step three, forming a circle of a first dam on the first inorganic layer corresponding to a peripheral region of the OLED device;

step four, forming a first organic layer on the first inorganic layer corresponding to an inside region of the first dam and curing the first organic layer;

the step four further including: curing the first dam before forming the first organic layer or curing the first organic layer and the first dam at the same time; and step five, forming a second inorganic layer on the first organic layer, the first dam and the first inorganic layer, wherein the second inorganic layer covers the first organic layer and the first dam, and an area of the second inorganic layer is greater than an area of a region surrounded by the first dam in a horizontal direction.

Thicknesses of the first inorganic layer and the second inorganic layer are 500 nm~2 µm.

Producing methods of the first inorganic layer and second inorganic layer respectively include at least one of Plasma Enhanced Chemical Vapor Deposition (PECVD), Atomic Layer Deposition (ALD) and Magnetron Sputtering.

Compositions of the first inorganic layer and the second inorganic layer respectively include at least one of Silicon Oxide, Silicon Nitride and Aluminum Oxide.

A height of the first dam is 500 nm~1000 nm;

A distance between an outer edge of the first dam and an edge of the first inorganic layer is 0.5 mm~2 mm.

A composition of the first dam includes at least one of a silicone resin and an acrylic resin.

A thickness of the first organic layer is 500 nm~1000 nm.

A producing method of the first organic layer includes at least one of screen printing, spin coating, ink jet printing, and cast film formation.

A composition of the first organic layer includes at least one of silicone resin and polymethylmethacrylate.

Optionally, the OLED packaging method further includes: step six, forming at least one packaging unit on the second inorganic layer, wherein the packaging unit includes a second dam, a second organic layer deposed in an inside region of the second dam and a third inorganic layer covering the second organic layer and the second dam.

The present invention further provides the OLED packaging structure, including: a substrate; an OLED device deposed on the substrate, a first inorganic layer deposed on the OLED device and substrate, a first dam deposed on the first inorganic layer corresponding to a peripheral region of the OLED device, a first organic layer deposed on the first inorganic layer corresponding to an inside region of the first dam and a second inorganic layer deposed on the first organic layer, the first dam and a first inorganic layer;

wherein the first inorganic layer covers the OLED device and an area of the first inorganic layer is greater than an area of the OLED device; and the second inorganic layer covers the first organic layer and the first dam and an area of the second inorganic layer is greater than an area of a region surrounded by the first dam in a horizontal direction.

Thicknesses of the first inorganic layer and the second inorganic layer are 500 nm~2 µm.

Compositions of the first inorganic layer and the second inorganic layer respectively include at least one of Silicon Oxide, Silicon Nitride and Aluminum Oxide.

A height of the first dam is 500 nm~1000 nm.

A distance between an outer edge of the first dam and an edge of the first inorganic layer is 0.5 mm~2 mm.

A composition of the first dam includes at least one of a silicone resin and an acrylic resin.

A thickness of the first organic layer is 500 nm~1000 nm.

A composition of the first organic layer includes at least one of silicone resin and polymethylmethacrylate.

Optionally, the OLED packaging structure further includes at least one packaging unit deposed on the second inorganic layer, wherein the packaging unit includes a second dam, a second organic layer deposed in an inside region of the second dam and a third inorganic layer covering the second organic layer and the second dam.

The present invention further provides the OLED packaging structure, including: a substrate; an OLED device deposed on the substrate, a first inorganic layer deposed on the OLED device and substrate, a first dam deposed on the first inorganic layer corresponding to a peripheral region of the OLED device, a first organic layer deposed on the first inorganic layer corresponding to an inside region of the first dam and a second inorganic layer deposed on the first organic layer, the first dam and a first inorganic layer;

wherein the first inorganic layer covers the OLED device and an area of the first inorganic layer is greater than an area of the OLED device; and the second inorganic layer covers the first organic layer and the first dam and an area of the second inorganic layer is greater than an area of a region surrounded by the first dam in a horizontal direction;

wherein thicknesses of the first inorganic layer and the second inorganic layer are 500 nm~2 µm; and compositions of the first inorganic layer and the second inorganic layer respectively include at least one of Silicon Oxide, Silicon Nitride and Aluminum Oxide;

wherein a height of the first dam is 500 nm~1000 nm;

a distance between an outer edge of the first dam and an edge of the first inorganic layer is 0.5 mm~2 mm; and a composition of the first dam includes at least one of a silicone resin and an acrylic resin.

Advantages of the present invention are that the present invention provides the OLED packaging method combining the dam packaging technology and the thin film encapsulation technology. The dam is used to coffer the organic layer and limit the size thereof to ensure that each organic layer is completely covered with the inorganic layer disposed thereon to improve the packaging effect. At the same time, one mask can be used to produce multiple inorganic layers so an amount of masks is decreased to save production costs. The present invention provides the OLED packaging structure combining the dam packaging structure and the thin film encapsulation structure. The dam is used to coffer an organic layer and limit the size thereof to ensure that each organic layer is completely covered with the inorganic layer disposed thereon to improve the packaging effect. At the same time, one mask can be used to produce multiple inorganic layers so an amount of masks is decreased to save production costs.

To further understand the features and technical aspects of the present invention, reference is made to the following detailed description of the present invention when taken in conjunction with the accompanying drawings, which are provided for the purpose of illustration and description only and are not intended to limit the present invention.

BRIEF DESCRIPTION OF THE DRAWINGS

The particular embodiments of present invention are described in detail with reference to the accompanying following drawings to make the technical solutions of the present invention and other advantageous effects stand out.

In the drawings.

DETAILED DESCRIPTION OF THE PREFERRED EMBODIMENTS

In order to further describe the technical means and their effects of the present invention, it is described in detail by combination of the following preferred embodiments of the present invention and drawings thereof.

Figure 1:
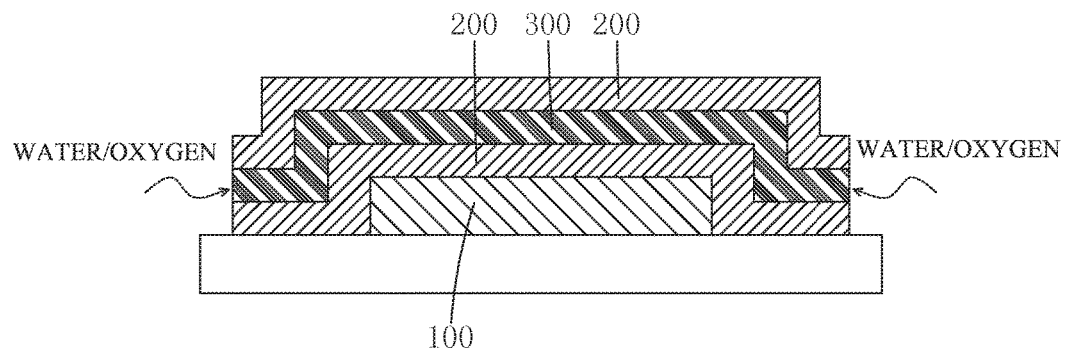
FIG. 1: a schematic cross-sectional view of a conventional thin film encapsulation structure.
Figure 2:
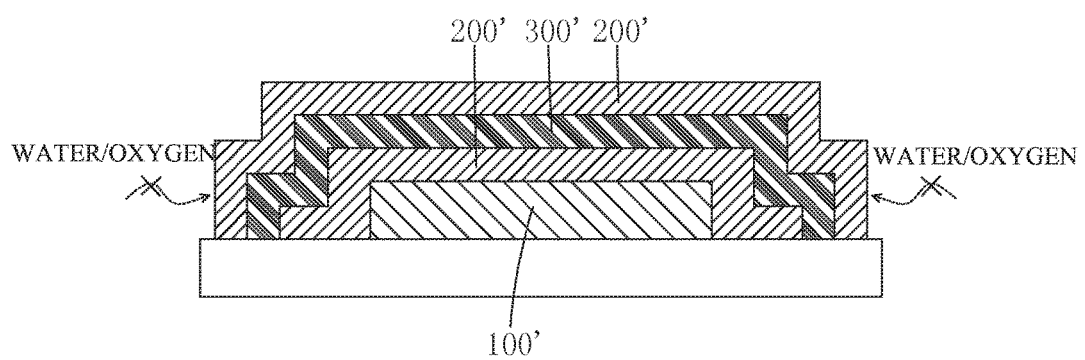
FIG. 2: a schematic cross-sectional view of another conventional thin film encapsulation structure.
Figure 3:
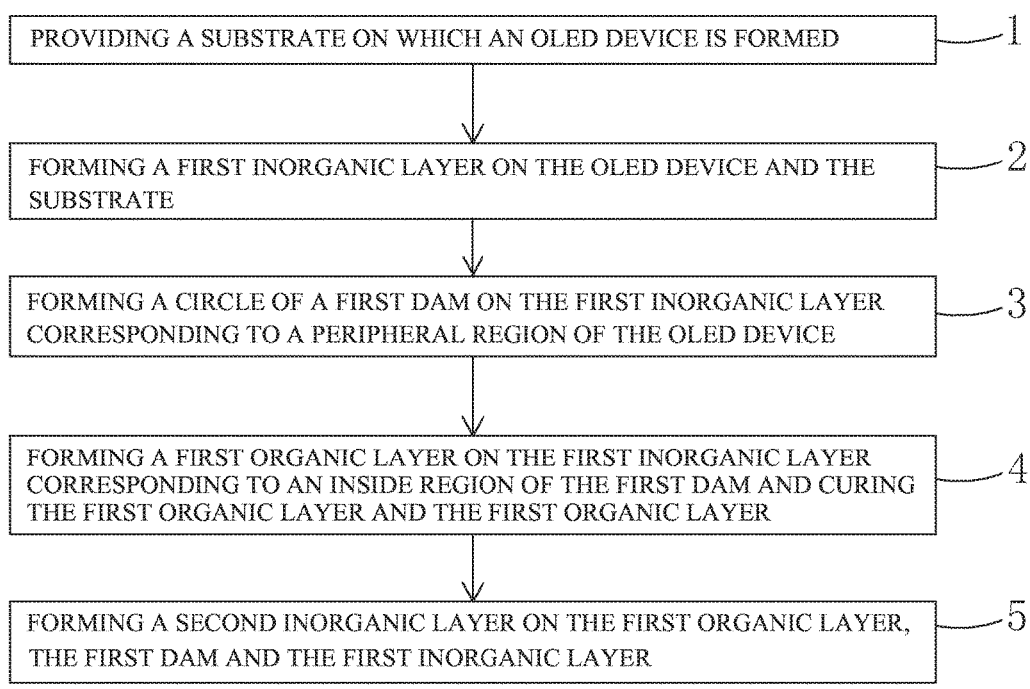
FIG. 3: a flow chart of an OLED packaging method in accordance with the present invention.

With reference to FIG. 3, the present invention provides an OLED packaging method having following steps.

Figure 4:
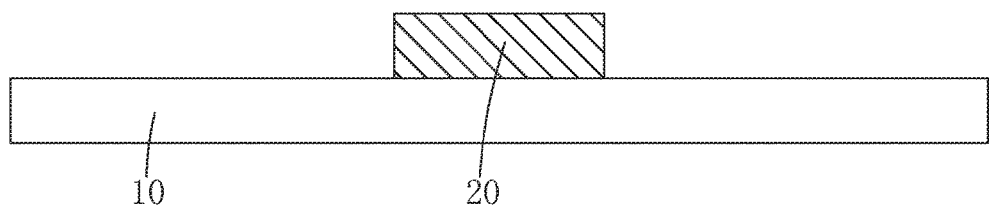
FIG. 4: a schematic view of step one of the OLED packaging method in accordance with the present invention.

Step one, as shown in FIG. 4, provides a substrate 10 on which an OLED device 20 is formed.

In particular, the substrate 10 is a TFT substrate.

Figure 5:
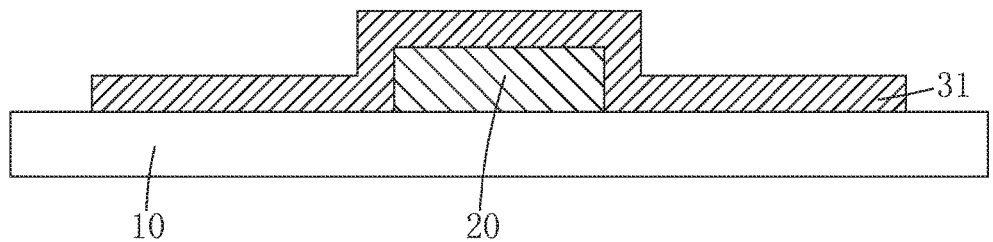
FIG. 5: a schematic view of step two of the OLED packaging method in accordance with the present invention.

Step two, as shown in FIG. 5, forms a first inorganic layer 31 on the OLED device 20 and the substrate 10, wherein the first inorganic layer 31 covers the OLED device 20 and an area of the first inorganic layer 31 is greater than that of the OLED device 20.

In particular, a thickness of the first inorganic layer 31 is 500 nm~2 μm.

In particular, a producing method of the first inorganic layer 31 includes at least one of Plasma Enhanced Chemical Vapor Deposition (PECVD), Atomic Layer Deposition (ALD) and Magnetron Sputtering.

In particular, a composition of the first inorganic layer 31 includes at least one of Silicon Oxide, Silicon Nitride and Aluminum Oxide.

Figure 6:
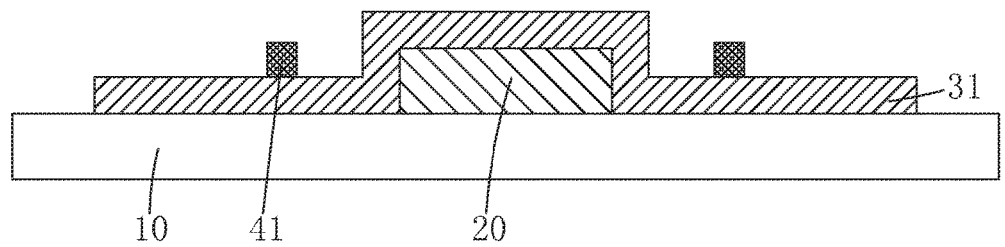
FIG. 6: a schematic view of step three of the OLED packaging method in accordance with the present invention.

Step three, as shown in FIG. 6, forms a circle of a first dam 41 on the first inorganic layer 31 corresponding to a peripheral region of the OLED device 20.

In Particular, a height of the first dam 41 is 500 nm~1000 nm.

In particular, a distance between an outer edge of the first dam 41 and an edge of the first inorganic layer 31 is 0.5 mm~2 mm.

In particular, a composition of the first dam 41 includes at least one of a silicone resin and an acrylic resin, so that a material of the first dam 41 has a good compatibility with a material of a first organic layer 51 in next production.

Preferably, a viscosity of the first dam 41 is 1000 cps~700 cps.

Figure 7:
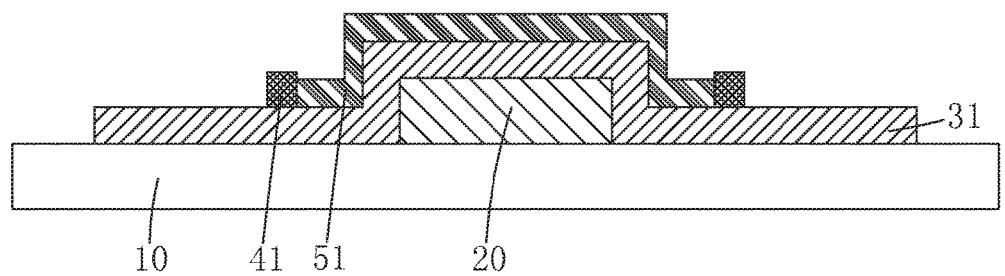
FIG. 7: a schematic view of step four of the OLED packaging method in accordance with the present invention.

Step four, as shown in FIG. 7, forms the first organic layer 51 on the first inorganic layer 31 corresponding to an inside region of the first dam 41 and cures the first organic layer 51.

The step four further cures the first dam 41 before forming the first organic layer 51, or in the step four, the first organic layer 51 and the first dam 41 are cured at the same time.

In the producing process of the first organic layer 51, the first dam provides a function of anti-overflow and limits a size of the organic layer 51 to ensure that a second inorganic layer 32 in next production completely covers the first organic layer 51 to increase a packaging effect. Since the viscosity of the uncured first dam 41 is high, the uncured first dam also provides a function of anti-overflow.

In particular, a thickness of the first organic layer 51 is 500 nm~1000 nm.

In particular, a producing method of the first organic layer 51 includes at least one of screen printing, spin coating, ink jet printing, and cast film formation.

In particular, a composition of the first organic layer 51 is organic resin. Preferably, the composition of the first organic layer 51 includes at least one of silicone resin and polymethylmethacrylate.

In particular, a way of curing the first dam 41 and the first organic layer 51 includes at least one of heat curing and UV curing. Preferably, the way of curing the first dam 41 and the first organic layer 51 is the UV curing.

Figure 8:
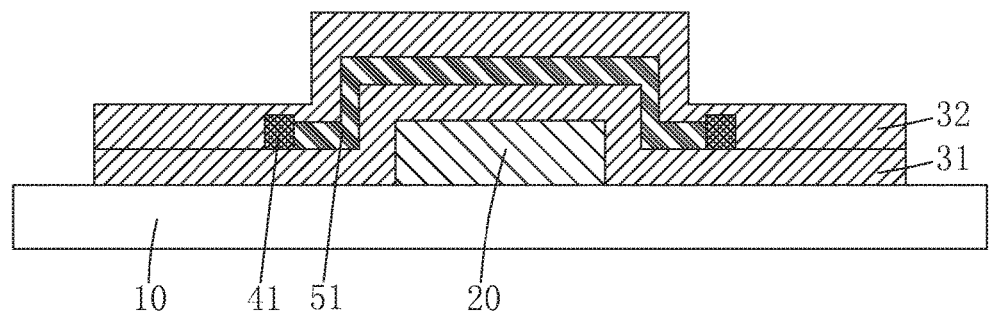
FIG. 8: a schematic view of step five of the OLED packaging method and a schematic cross-sectional view of a first embodiment of an OLED packaging structure in accordance with the present invention.

Step five, as shown in FIG. 8, forms the second inorganic layer 32 on the first organic layer 51, the first dam 41 and the first inorganic layer 31. The second inorganic layer 32 covers the first organic layer 51 and the first dam 41 and an area of the second inorganic layer 32 is greater than an area of a region surrounded by the first dam 41 in a horizontal direction.

In particular, a thickness of the second inorganic layer 32 is 500 nm~2 μm.

In particular, a producing method of the second inorganic layer 32 includes at least one of PECVD, ALD and Magnetron Sputtering.

In particular, a composition of the second inorganic layer 32 includes at least one of Silicon Oxide, Silicon Nitride and Aluminum Oxide.

In particular, the second inorganic layer 32 and the first inorganic layer 31 can be produced by using the same mask to decrease an amount of the masks accordingly and to save production costs.

Optionally, the OLED packaging method of the present invention further includes following steps.

Figure 9:
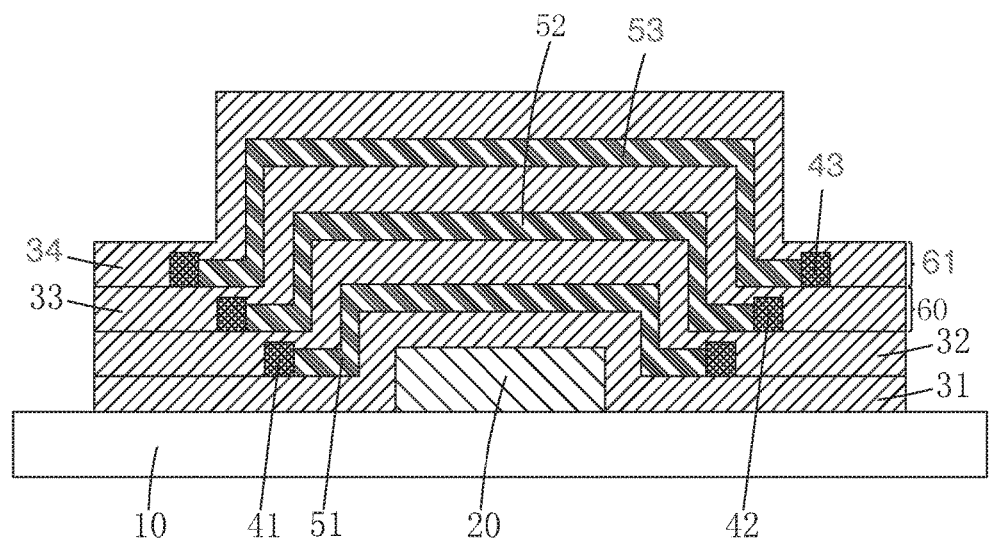
FIG. 9: a schematic view of step six of the OLED packaging method and a schematic cross-sectional view of a second embodiment of the OLED packaging structure in accordance with the present invention.

Step 6, as shown in FIG. 9, forms at least one packaging unit 60 on the second inorganic layer 32. The packaging unit 60 includes a second dam 42, a second organic layer 52 deposed in an inside region of the second dam 42 and a third inorganic layer 33 covering the second organic layer 52 and the second dam 42.

In particular, an area of the third inorganic layer 33 is greater than an area of the region surrounded by the second dam 42 in the horizontal direction.

Preferably, the second dam 42 is located on an outside of the first dam 41 in the horizontal direction.

Preferably, horizontal distances between the second dams 42 of the packaging unit 60 and the OLED device 20 are gradually increased from bottom to top of the substrate 10.

In particular, a height of the second dam 42 is 500 nm~1000 nm.

In particular, a composition of the second dam 42 includes at least one of a silicone resin and an acrylic resin.

In particular, a thickness of the third inorganic layer 33 is 500 nm~2 μm.

In particular, a producing method of the third inorganic layer 33 includes at least one of PECVD, ALD and Magnetron Sputtering.

In particular, a composition of the third inorganic layer 33 includes at least one of Silicon Oxide, Silicon Nitride and Aluminum Oxide.

In particular, a thickness of the second organic layer 52 is 500 nm~1000 nm.

In particular, a producing method of the second organic layer 52 includes at least one of screen printing, spin coating, ink jet printing, and cast film formation.

In particular, a composition of the second organic layer 52 is organic resin. Preferably, the composition of the second organic layer 52 includes at least one of Silicone and polymethylmethacrylate.

In particular, a way of curing the second dam 42 and the second organic layer 52 includes at least one of heat curing and UV curing. Preferably, the way of curing the second dam 42 and the second organic layer 52 is the heat curing.

In particular, the third inorganic layer 33, the first inorganic layer 31 and the second inorganic layer 32 can be produced by using the same mask to decrease an amount of the masks accordingly and to save production costs.

The steps one to five of the OLED packaging method of the present invention are described in detail below in connection with two preferred embodiments.

Embodiment One

Step one, as shown in FIG. 4, provides a substrate 10 on which an OLED device 20 is formed.

Step two, as shown in FIG. 5, forms a first inorganic layer 31 on the OLED device 20 and the substrate 10, wherein the first inorganic layer 31 covers the OLED device 20 and an area of the first inorganic layer 31 is greater than that of the OLED device 20.

A composition of the first inorganic layer 31 is Silicon Nitride.

A producing method of the first inorganic layer 31 is PECVD. The process parameters of PECVD are as follows: silane (SiH4) and ammonia (NH3) are used as the reaction gas and the purities of silane and ammonia are more than 99.99%. An auxiliary ionization gas is argon (Ar) (purity thereof is 99.99%), a power of an RF power source is 10 W~500 W, a deposition chamber pressure is 10 Pa~20 Pa, a deposition rate is 3 nm/s~20 nm/s and a deposition time is 20 min~60 min.

Step three, as shown in FIG. 6, forms a circle of a first dam 41 on the first inorganic layer 31 corresponding to a peripheral region of the OLED device 20.

A height of the first dam 41 is 500 nm~1000 nm.

A distance between an outer edge of the first dam 41 and an edge of the first inorganic layer 31 is 0.5 mm~2 mm.

Step four, as shown in FIG. 7, forms a first organic layer 51 on the first inorganic layer 31 corresponding to an inside region of the first dam 41 and cures the first dam 41 and the first organic layer 51 at the same time.

A producing method of the first organic layer 51 is ink jet printing.

A major composition of the first organic layer 51 is silicone resin. Preferably, a viscosity of silicone resin is 10 cps~20 cps.

A thickness of the first organic layer 51 is 500 nm~1000 nm.

A way of curing the first dam 41 and the first organic layer 51 is the UV curing. In a process of UV curing, an energy density of UV light is 5000 mJ/cm2 and UV irradiation time is 30 s~90 s.

Step five, as shown in FIG. 8, forms the second inorganic layer 32 on the first organic layer 51 and the first inorganic layer 31. The second inorganic layer 32 covers the first organic layer 51 and the first dam 41 and an area of the second inorganic layer 32 is greater than an area of the region surrounded by the first dam 41 in a horizontal direction.

Embodiment Two

Step one, as shown in FIG. 4, provides a substrate 10 on which an OLED device 20 is formed.

Step two, as shown in FIG. 5, forms a first inorganic layer 31 on the OLED device 20 and the substrate 10, wherein the first inorganic layer 31 covers the OLED device 20 and an area of the first inorganic layer 31 is greater than that of the OLED device 20.

A composition of the first inorganic layer 31 is Aluminum Oxide.

A producing method of the first inorganic layer 31 is Magnetron Sputtering. The process parameters of Magnetron Sputtering are as follows: an auxiliary fission gas is argon (Ar) (purity thereof is 99.99%), a power of an RF power source is 10 W~500 W, a deposition chamber pressure is 10 Pa~20 Pa, and a deposition time is 20 min~60 min.

Step three, as shown in FIG. 6, forms a circle of a first dam 41 on the first inorganic layer 31 corresponding to a peripheral region of the OLED device 20.

A height of the first dam 41 is 500 nm~1000 nm.

A distance between an outer edge of the first dam 41 and an edge of the first inorganic layer 31 is 0.5 mm~2 mm.

Step four, as shown in FIG. 7, forms the first organic layer 51 on the first inorganic layer 31 corresponding to an inside region of the first dam 41 and cures the first dam 41 and the first organic layer 51 at the same time.

A producing method of the first organic layer 51 is screen printing. A major composition of the first organic layer 51 is polymethylmethacrylate.

A thickness of the first organic layer 51 is 500 nm~1000 nm.

A way of curing the first dam 41 and the first organic layer 51 is the heat curing. The conditions of heat curing are that heating temperature is 60° C.~90° C. and heating time is 30 min~90 min.

Step five, as shown in FIG. 8, forms the second inorganic layer 32 on the first organic layer 51 and the first inorganic layer 31. The second inorganic layer 32 covers the first organic layer 51 and the first dam 41 and an area of the second inorganic layer 32 is greater than an area of the region surrounded by the first dam 41 in a horizontal direction.

The OLED packaging method combines a dam packaging technology and a thin film encapsulation technology. A dam is used to coffer an organic layer and limit a size thereof to ensure that each organic layer is completely covered with an inorganic layer disposed thereon to improve a packaging effect. One mask can be used to produce multiple inorganic layers so an amount of masks is decreased to save production costs.

As shown in FIG. 8, according to above-mentioned OLED packaging method the present invention also provides an OLED packaging structure including: a substrate 10, an OLED device 20 deposed on the substrate 10, a first inorganic layer deposed on the OLED device 20 and substrate 10, a first dam 41 deposed on the first inorganic layer 31 corresponding to a peripheral region of the OLED device 20, a first organic layer 51 deposed on the first inorganic layer 31 corresponding to an inside region of the first dam 41 and a second inorganic layer 32 deposed on the first organic layer 51, the first dam 41 and a first inorganic layer 31.

The first inorganic layer 31 covers the OLED device 20 and an area of the first inorganic layer 31 is greater than an area of the OLED device 20. The second inorganic layer 32 covers the first organic layer 51 and the first dam 41 and an area of the second inorganic layer 32 is greater than an area of the region surrounded by the first dam 41 in a horizontal direction.

In particular, the substrate 10 is a TFT substrate.

In particular, thicknesses of the first inorganic layer 31 and the second inorganic layer 32 are 500 nm~2 μm.

In particular, compositions of the first inorganic layer 31 and the second inorganic layer 32 respectively include at least one of Silicon Oxide, Silicon Nitride and Aluminum Oxide.

Preferably, material and size of the second inorganic layer 32 and a projection position thereof projected on the substrate 10 is the same as these of the first inorganic layer 31.

In Particular, a height of the first dam 41 is 500 nm~1000 nm.

In particular, a distance between an outer edge of the first dam 41 and an edge of the first inorganic layer 31 is 0.5 mm~2 mm.

In particular, a composition of the first dam 41 includes at least one of a silicone resin and an acrylic resin.

Preferably, a viscosity of the first dam 41 is 1000 cps~700 cps.

In particular, a thickness of the first organic layer 51 is 500 nm~1000 nm.

In particular, a composition of the first organic layer 51 is organic resin. Preferably, the composition of the first organic layer 51 includes at least one of silicone resin and polymethylmethacrylate.

As shown in FIG. 9, optionally, the OLED packaging structure may further include: at least one packaging unit (such as two packaging units 60, 61, as shown in FIG. 9) disposed on the second inorganic layer 32. The packing unit 60, 61 includes a second or third dam 42, 43, a second or third organic layer 52, 53 disposed in an inside region of the second or third dam 42, 43 and a third or fourth inorganic layer 33, 34 covering the second or third organic layer 52, 53 and the second or third dam 42, 43.

In particular, an area of the third inorganic layer 33 is greater than an area of the region surrounded by the second dam 42 in the horizontal direction.

Preferably, the second dam 42 is located on an outside of the first dam 41 in the horizontal direction.

Preferably, horizontal distances between the second dams 42 of the packaging unit 60 and the OLED device 20 are gradually increased from bottom to top of the substrate 10.

In particular, a height of the second dam 42 is 500 nm~1000 nm.

In particular, a composition of the second dam 42 includes at least one of a silicone resin and an acrylic resin.

In particular, a thickness of the third inorganic layer 33 is 500 nm~2 μm.

In particular, a composition of the third inorganic layer 33 includes at least one of Silicon Oxide, Silicon Nitride and Aluminum Oxide.

Preferably, material and size of the third inorganic layer 33 and a projection position thereof projected on the substrate 10 is the same as these of the first inorganic layer 31 and the second inorganic layer 32.

In particular, a thickness of the second organic layer 52 is 500 nm~1000 nm.

In particular, a composition of the second organic layer 52 is organic resin. Preferably, the composition of the second organic layer 52 includes at least one of Silicone and polymethylmethacrylate.

The OLED packaging structure combines a dam packaging structure and a thin film encapsulation structure. A dam is used to coffer an organic layer and limit a size thereof to ensure that each organic layer is completely covered with an inorganic layer disposed thereon to improve a packaging effect. One mask can be used to produce multiple inorganic layers so an amount of masks is decreased to save production costs.

Based on foregoing description, the present invention provides the OLED packaging method and the OLED packaging structure. The OLED packaging method of the present invention combines the dam packaging technology and the thin film encapsulation technology. The dam is used to coffer the organic layer and limit the size thereof to ensure that each organic layer is completely covered with the inorganic layer disposed thereon to improve the packaging effect. At the same time, one mask can be used to produce multiple inorganic layers so an amount of masks is decreased to save production costs. The OLED packaging structure of the present invention combines the dam packaging structure and the thin film encapsulation structure. The dam is used to coffer an organic layer and limit the size thereof to ensure that each organic layer is completely covered with the inorganic layer disposed thereon to improve the packaging effect. At the same time, one mask can be used to produce multiple inorganic layers so an amount of masks is decreased to save production costs.

As described above, it is apparent to person skilled in the art that various other changes and modifications may be made in accordance with the technical solutions and technical concepts of the present invention, and all such changes and modifications are intended to be within the scope of the claims of the present invention.

What is claimed is:
1. An Organic Light Emitting Display (OLED) packaging method, comprising the following steps:
    step one, providing a substrate on which an OLED device is formed;
    step two, forming a first inorganic layer on the OLED device and the substrate, wherein the first inorganic layer covers the OLED device and an area of the first inorganic layer is greater than that of the OLED device;
    step three, forming a circle of a first dam on the first inorganic layer corresponding to a peripheral region of the OLED device;
    step four, forming a first organic layer on the first inorganic layer corresponding to an inside region of the first dam and curing the first organic layer;

the step four further comprising: curing the first dam before forming the first organic layer or curing the first organic layer and the first dam at the same time; and step five, forming a second inorganic layer on the first organic layer, the first dam and the first inorganic layer, wherein the second inorganic layer covers the first organic layer and the first dam, and an area of the second inorganic layer is greater than an area of a region surrounded by the first dam in a plan view;

wherein the first inorganic layer having a top surface that is distant from the OLED device and the substrate; the first dam is formed on the top surface of the first inorganic layer; and the first organic layer is formed on the top surface of the first inorganic layer and is located inboard of the circle of the first dam, the first organic layer and the dam being both covered by the second inorganic layer and interposed between the first and second inorganic layers.

2. The OLED packaging method according to claim 1, wherein thicknesses of the first inorganic layer and the second inorganic layer are 500 nm~2 µm;

producing methods of the first inorganic layer and second inorganic layer respectively comprise at least one of Plasma Enhanced Chemical Vapor Deposition (PECVD), Atomic Layer Deposition (ALD) and Magnetron Sputtering; and compositions of the first inorganic layer and the second inorganic layer respectively comprise at least one of Silicon Oxide, Silicon Nitride and Aluminum Oxide.

3. The OLED packaging method according to claim 1, wherein a height of the first dam is 500 nm~1000 nm;

a distance between an outer edge of the first dam and an edge of the first inorganic layer is 0.5 mm~2 mm; and a composition of the first dam comprises at least one of a silicone resin and an acrylic resin.

4. The OLED packaging method according to claim 1, wherein a thickness of the first organic layer is 500 nm~1000 nm;

a producing method of the first organic layer comprises at least one of screen printing, spin coating, ink jet printing, and cast film formation; and a composition of the first organic layer comprises at least one of silicone resin and polymethylmethacrylate.

5. The OLED packaging method according to claim 1, further comprising:

step six, forming at least one packaging unit on the second inorganic layer, wherein the packaging unit comprises a second dam, a second organic layer disposed in an inside region of the second dam and a third inorganic layer covering the second organic layer and the second dam, wherein the second dam is formed on a top surface of the second inorganic layer and the second organic layer is formed on the top surface of the second inorganic layer and is located inboard of the second dam.

6. An Organic Light Emitting Display (OLED) packaging structure, comprises a substrate; an OLED device disposed on the substrate, a first inorganic layer disposed on the OLED device and substrate, a first dam disposed on the first inorganic layer corresponding to a peripheral region of the OLED device, a first organic layer disposed on the first inorganic layer corresponding to an inside region of the first dam and a second inorganic layer disposed on the first organic layer, the first dam and the first inorganic layer;

wherein the first inorganic layer covers the OLED device and an area of the first inorganic layer is greater than an area of the OLED device; and the second inorganic layer covers the first organic layer and the first dam and an area of the second inorganic layer is greater than an area of a region surrounded by the first dam in a plan view;

wherein the first inorganic layer having a top surface that is distant from the OLED device and the substrate; the first dam is formed on the top surface of the first inorganic layer; and the first organic layer is formed on the top surface of the first inorganic layer and is located inboard of the circle of the first dam, the first organic layer and the dam being both covered by the second inorganic layer and interposed between the first and second inorganic layers.

7. The OLED packaging structure according to claim 6, wherein thicknesses of the first inorganic layer and the second inorganic layer are 500 nm~2 µm;

compositions of the first inorganic layer and the second inorganic layer respectively comprise at least one of Silicon Oxide, Silicon Nitride and Aluminum Oxide.

8. The OLED packaging structure according to claim 6, wherein a height of the first dam is 500 nm~1000 nm;

a distance between an outer edge of the first dam and an edge of the first inorganic layer is 0.5 mm~2 mm; and a composition of the first dam comprises at least one of a silicone resin and an acrylic resin.

9. The OLED packaging structure according to claim 6, wherein a thickness of the first organic layer is 500 nm~1000 nm; and a composition of the first organic layer comprises at least one of silicone resin and polymethylmethacrylate.

10. The OLED packaging structure according to claim 6, further comprising:

at least one packaging unit disposed on the second inorganic layer, wherein the packaging unit comprises a second dam, a second organic layer disposed in an inside region of the second dam and a third inorganic layer covering the second organic layer and the second dam, wherein the second dam is formed on a top surface of the second inorganic layer and the second organic layer is formed on the top surface of the second inorganic layer and is located inboard of the second dam.

11. An Organic Light Emitting Display (OLED) packaging structure, comprises a substrate; an OLED device disposed on the substrate, a first inorganic layer disposed on the OLED device and substrate, a first dam disposed on the first inorganic layer corresponding to a peripheral region of the OLED device, a first organic layer disposed on the first inorganic layer corresponding to an inside region of the first dam and a second inorganic layer disposed on the first organic layer, the first dam and a first inorganic layer;

wherein the first inorganic layer covers the OLED device and an area of the first inorganic layer is greater than an area of the OLED device; and the second inorganic layer covers the first organic layer and the first dam and an area of the second inorganic layer is greater than an area of a region surrounded by the first dam in a plan view;

wherein the first inorganic layer having a top surface that is distant from the OLED device and the substrate; the first dam is formed on the top surface of the first inorganic layer; and the first organic layer is formed on the top surface of the first inorganic layer and is located inboard of the circle of the first dam, the first organic layer and the dam being both covered by the second inorganic layer and interposed between the first and second inorganic layers;

wherein thicknesses of the first inorganic layer and the second inorganic layer are 500 nm~2 µm; and compositions of the first inorganic layer and the second inorganic layer respectively comprise at least one of Silicon Oxide, Silicon Nitride and Aluminum Oxide;

wherein a height of the first dam is 500 nm~1000 nm;

a distance between an outer edge of the first dam and an edge of the first inorganic layer is 0.5 mm~2 mm; and a composition of the first dam comprises at least one of a silicone resin and an acrylic resin.

12. The OLED packaging structure according to claim 11, wherein a thickness of the first organic layer is 500 nm~1000 nm; and a composition of the first organic layer comprises at least one of silicone resin and polymethylmethacrylate.

13. The OLED packaging structure according to claim 11, further comprising: at least one packaging unit disposed on the second inorganic layer, wherein the packaging unit comprises a second dam, a second organic layer disposed in an inside region of the second dam and a third inorganic layer covering the second organic layer and the second dam, wherein the second dam is formed on a top surface of the second inorganic layer and the second organic layer is formed on the top surface of the second inorganic layer and is located inboard of the second dam.

* * * * *